United States Patent [19]
Osakabe et al.

[11] Patent Number: 5,192,867
[45] Date of Patent: Mar. 9, 1993

[54] ELECTRON OPTICAL MEASUREMENT APPARATUS

[75] Inventors: Nobuyuki Osakabe, Kawagoe; Junji Endo, Sakado; Akira Tonomura, Saitama; Masahiro Tomita, Katsuta; Tadao Furutsu, Hitachi, all of Japan

[73] Assignee: Hitachi, Ltd., Tokyo, Japan

[21] Appl. No.: 697,576

[22] Filed: May 9, 1991

Related U.S. Application Data

[63] Continuation-in-part of Ser. No. 663,472, Mar. 4, 1991, abandoned, which is a continuation of Ser. No. 462,769, Nov. 10, 1990, Pat. No. 4,998,788.

[30] Foreign Application Priority Data

Jan. 13, 1989 [JP] Japan .................................. 1-004999
May 9, 1990 [JP] Japan .................................. 2-117544

[51] Int. Cl.⁵ .............................................. G03H 1/00
[52] U.S. Cl. ................................. 250/311; 250/492.3; 359/1; 359/27
[58] Field of Search ............... 359/1, 10, 27; 250/306, 250/307, 311, 492.1, 492.3

[56] References Cited

U.S. PATENT DOCUMENTS

| | | | |
|---|---|---|---|
| 3,761,721 | 9/1973 | Altshuler et al. | 359/1 |
| 4,532,422 | 7/1985 | Nomura et al. | 250/306 |
| 4,935,625 | 6/1990 | Hasegawa et al. | |
| 4,950,909 | 8/1990 | Yokoto et al. | 250/442.11 |
| 4,998,788 | 3/1991 | Osakabe et al. | 359/1 |

OTHER PUBLICATIONS

Osakabe et al, "Observation of atomic steps by reflection electron holography", *Japanese Journal of Applied Physics Letters*, vol. 27, No. 9, Sep. 1988, pp. 1772-1774.
Tonomura, "Applications of electron holography using a field-emission electron microscope," *Journal of Electron Microscopy*, vol. 33, No. 2, 1984, pp. 101-115.
Missiroli et al, "Electron interferometry and interference electron microscopy", *Journal of Physics E. Scientific Instruments*, vol. 14, No. 6, 1981 pp. 649-653, 662, 664.
"Electron Microscope", vol. 10, No. 2, 1975, pp. 111-118.

*Primary Examiner*—Bruce Y. Arnold
*Assistant Examiner*—J. P. Ryan
*Attorney, Agent, or Firm*—Antonelli, Terry, Stout & Kraus

[57] ABSTRACT

In an electron holography apparatus having an electron source, a specimen holder, an electron lens system, and an electron biprism, the electron biprism is so constructed as to be rotatable about the electron optics axis. The rotation angle about the electron optics axis is commanded by the operator of the electron holography apparatus. A central wire of the electron biprism is allowed to be translated in a direction orthogonal to the electron optics axis, thus permitting the application of the fringe scanning method. The center of an aperture is selectively allowed to be aligned with that of the electron biprism to ensure that the measurement apparatus can be used selectively as either the electron holography apparatus or an electron microscope.

5 Claims, 8 Drawing Sheets

ELECTRON OPTICAL MEASUREMENT APPARATUS

CROSS-REFERENCE TO RELATED APPLICATIONS

This application is a continuation-in-part of a copending U.S. application Ser. No. 06/663,472 filed on Mar. 4, 1991 which is a continuation application of a U.S. application Ser. No. 07/462769 filed on Jan. 10, 1990, now patented as U.S. Pat. No. 4,998,788, the disclosure of the latter is hereby incorporated by reference.

BACKGROUND OF THE INVENTION

The present invention relates to an electron measurement apparatus such as for example an electron holography apparatus and an electron microscope.

In the field of transmission type electron microscope, there has already been known a technique for adjusting excitation of electron magnetic lenses such that the position of an image to be observed will not be rotated when the magnification is changed, and standard electron microscopes have the above function. Also, as described in "Rotary Electron Biprism" ("Electron Microscope", Vol. 10, No. 2, 1975, page 111), a technique has been known by which the electron biprism is rotated by rotating a pulley pulled by a spring.

SUMMARY OF THE INVENTION

The hologram formed by the electron biprism has an elongated rectangular shape in the direction of the prism wire. Accordingly, for an elongated specimen, operation for aligning the specimen and hologram in the same direction is needed. In case where the region to be transmitted or reflected by the reference wave lies in only a specified direction, satisfactory observation cannot sometimes be carried out without aligning the specimen and hologram.

The electron microscope on the other hand typically uses magnetic electron lenses. The magnetic electron lens fulfils itself by magnifying images but adversely it also functions to rotate images as mentioned above. Therefore, even under the condition that adjustment of the directional relationship between the electron biprism and specimen image has been settled, the directional relationship changes as the condition of magnetic lens, such as magnification, changes. Practically, the specimen holder of electron microscope used widely has the additional function of heating and cooling and it is very difficult to add a rotation mechanism to the holder having the additional function. In effect, the orientation of the specimen can hardly be adjusted in advance inside the narrow space of the objective lens, impairing operational facilities.

When the specimen is desired to be observed at a desired value of magnification, it is important that individual magnification values of a plurality of lenses are combined together optimally from the standpoint of aberration of the lenses but the directional relationship between the electron biprism and specimen image imposes constraint upon the combination, thus imparing operational facilities.

Firstly, rotation of an image in the electron holography apparatus will be described in brief. A specimen is projected by means of a plurality of electron lenses and an electron biprism on the viewing plane to form thereon a hologram image (an interference region in which electron waves are overlapped by means of the electron biprism.) and a specimen image. Then, it is important for the holography apparatus that directions of the specimen image and hologram image coincide with each other. But since the image of specimen is caused to rotate by each of the plural magnetic lenses before being projected on the viewing plane, the direction of the specimen image does not in general coincide with that of the hologram image. Even if the specimen is once set to meet the coincidence, the image might be rotated when the operator changes the magnification, for example, to look at the specimen closely.

Even for the same total magnification, rotation of the image is caused by setting each of the plural electron lenses in a different way but to result in the same total magnification. In this case, the directional relationship between the specimen image and the electron biprism is determined by only the electron lenses located between the specimen and the electron biprism. Rotation due to the electron lenses equipped between the electron biprism and the viewing plane equally influences the specimen image and the electron biprism image.

The rotation of image caused by the electron lens will now be described more specifically.

(1) A rotation angle $\theta$ of image due to an electron lens is written as $$\theta = \sqrt{(e/8m\,\phi)} \int B(z)dz.$$

On the other hand, focal distance f in the thin lens approximation can be given by $$1/f = (e/8\,m\phi) \int B(z)^2\, dz$$

where e is electronic charge, m is mass of electron, $\phi$ is accelerating voltage and B(z) is magnetic field distribution on the axis of magnetic lens. The image rotation angle depends on the direction of magnetic field but the focal distance depends on the absolute value of magnetic field, and consequently two values of image rotation angle can be selected for a settled focal distance.

(2) Total magnification M in an n-stage composite lens system can be given by $$M = \frac{(a/b)\cdot S_1 S_2 \cdots S_{n-1}}{(l_1 - S_1)\cdot(l_2 - S_2)\cdots(l_{n-1} - S_{n-1})}$$

where characters are defined such that Si represents image forming position of an i-th lens, li distance between adjacent lenses, a distance between specimen and objective lens and b distance between image forming position and projection lens. While a, b and li are fixed unless the lenses are moved mechanically, a few values of Si can be selected for fixed total magnification M. Since Si is determined by a focal distance of each lens, values of rotation angle corresponding to values of focal distance take place.

Accordingly, an object of the invention is to provide an improved measurement apparatus in which the specimen can be set desirably in the measurement apparatus.

Another object of the invention is to provide an electron holography apparatus in which the directional relationship between specimen image and electron biprism can be set desirably and even when the condition, for example, magnification of lens is changed, the set directional relationship between the specimen and electron biprism can remain unchanged.

Still another object of the invention is to provide an improved measurement apparatus which is useful for use as either a transmission type or a reflection type electron holography apparatus.

Still another object of the invention is to provide an improved measurement apparatus which can be used as either an ordinary electron microscope or an electron holography apparatus and in which switching between the two use modes can be effected easily.

Still another object of the invention is to provide an electron holography apparatus in which setting of magnification can be carried out independently of setting of rotation angle of the electron biprism about the electron optics axis.

Thus, in accordance with the invention, a value of magnification suitable for observation is first selected and the angle of rotation of the electron biprism about the electron optics axis is so selected as to compensate for the image rotation due to the selected magnification. Further, the electron biprism is movably disposed and as necessary, the apparatus can be used as an ordinary electron microscope.

DESCRIPTION OF THE PREFERRED EMBODIMENTS

Figure 1:
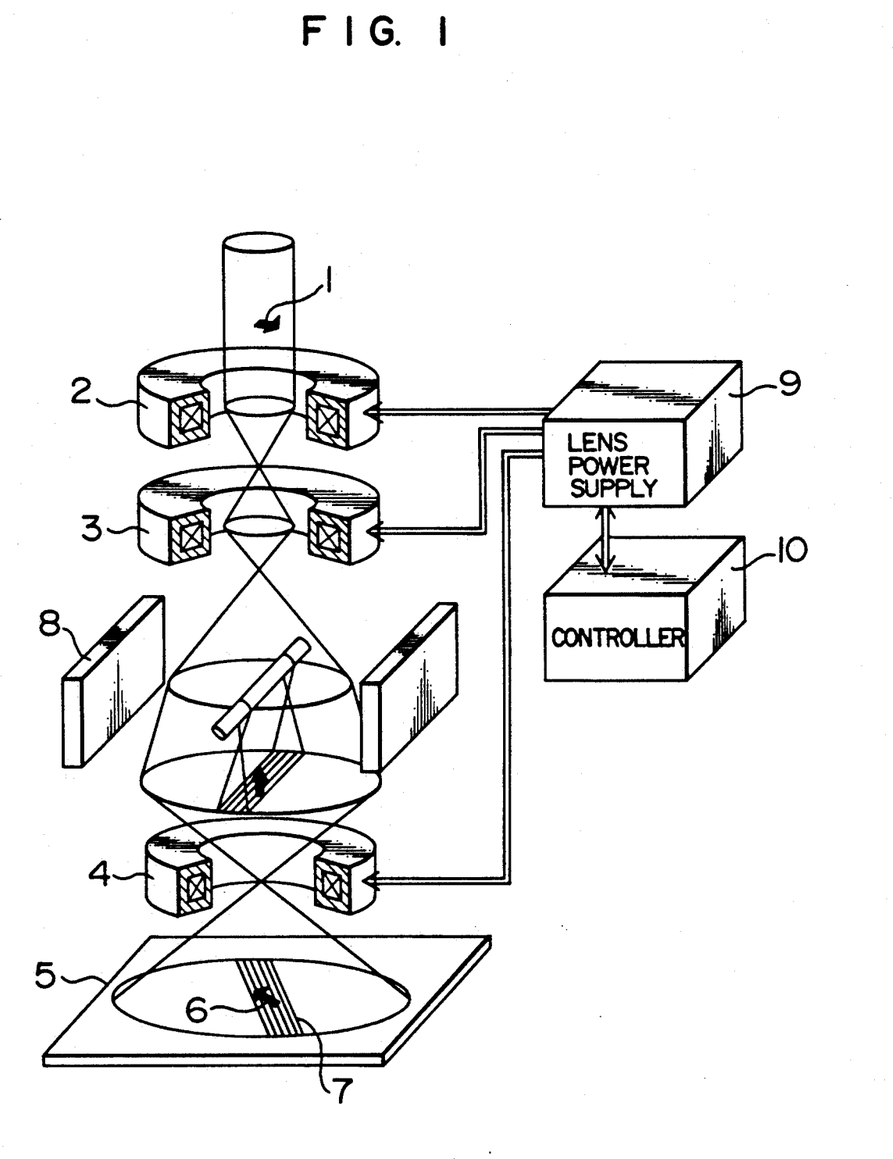
FIG. 1 is a diagram useful to explain the principle of the electron holography apparatus.

Referring to FIG. 1 useful to explain the principle of the electron holography apparatus, an image of a specimen 1 is projected as a specimen image 6, together with a hologram image 7, on a viewing plane 5 by means of electron lenses 2, 3 and 4 as described previously. Also illustrated in FIG. 1 are an electron biprism 8, a lens power supply 9 and a controller 10. It is important for the holography apparatus that directions of the specimen image 6 and hologram image 7 coincide with each other. But since the image of specimen 1 is caused to rotate by each of the lenses 2 and 3 before being projected on the viewing plane 5, the direction of the specimen image 6 does not in general coincide with that of the hologram image 7. Even if the specimen is so placed as to meet the coincidence, the angle of rotation of the specimen image changes as the magnification, for example, of the electron lens is changed by controlling the lens power supply, thus disturbing the coincidence. Even for the same magnification, rotation of the image is caused by each of the lenses 2 and 3 when exciting conditions of the lenses 2, 3 and 4 are changed and as a result, the directional relationship is changed.

Figure 2:
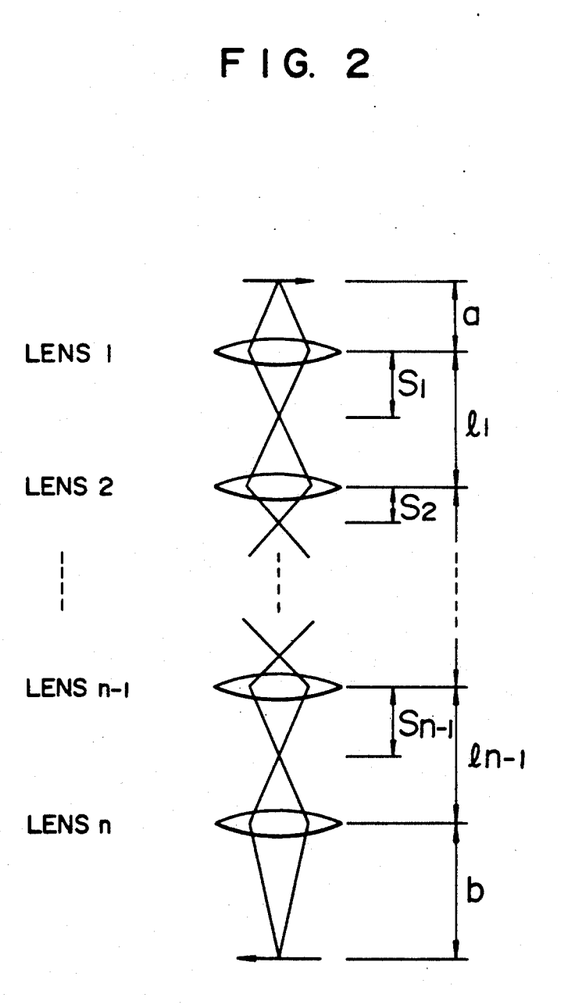
FIG. 2 is a diagram useful in explaining the image forming condition in a composite lens system.

An example of a lens arrangement used for the aforementioned calculation of total magnification M of n-stage lenses is illustrated in FIG. 2 showing the image forming condition in a composite lens system.

Figure 3:
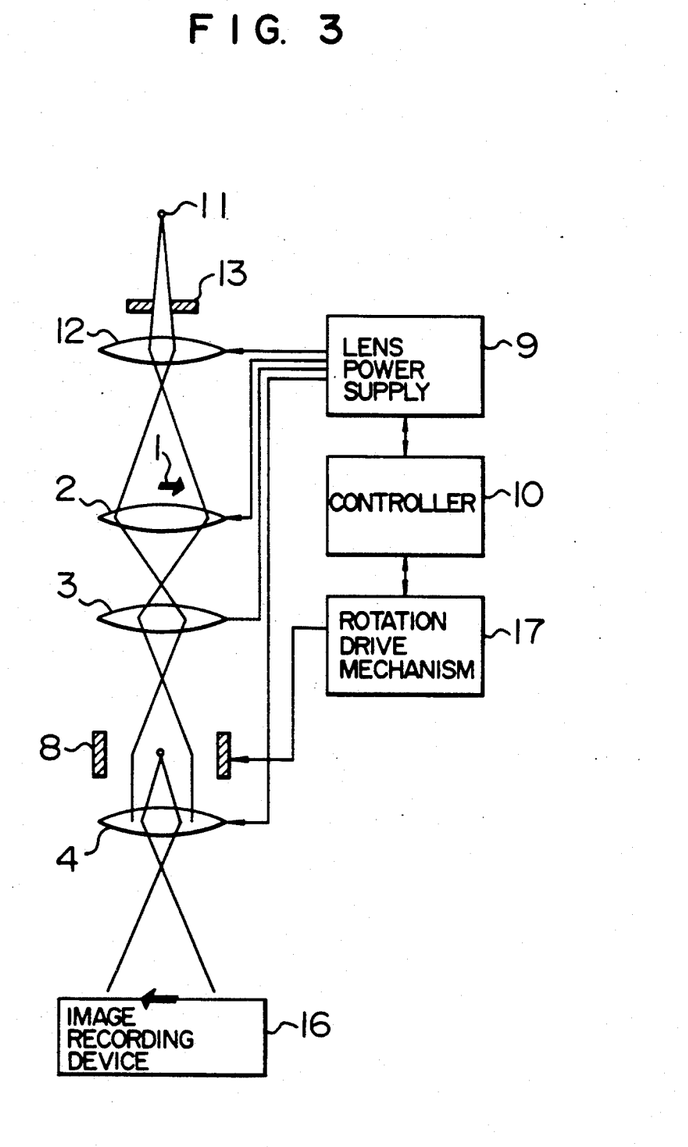
FIG. 3 is a diagram useful to explain a first embodiment of an electron holography apparatus according to the invention.
Figure 4:
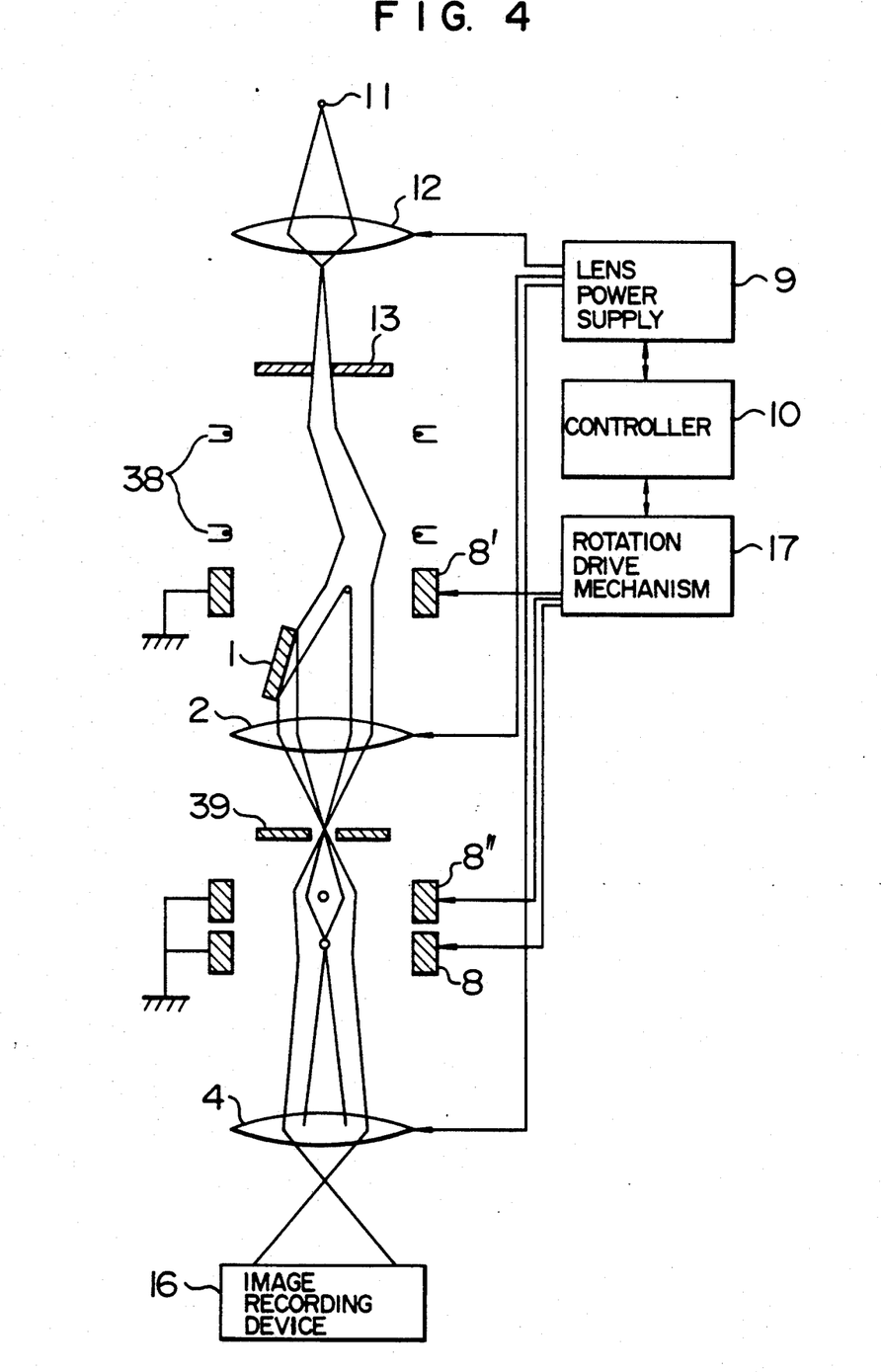
FIG. 4 is a diagram useful to explain a second embodiment of the invention.

Preferred embodiments of the invention will now be described with reference to the accompanying drawings. FIGS. 3 and 4 are diagrams useful to explain embodiments of electron holography apparatus of different types according to the invention.

FIG. 3 shows an embodiment of a transmission type electron holography apparatus. Referring to FIG. 3, an electron beam emitted from an electron source 11 is collimated by means of a condenser aperture 13 and a condenser lens 12 and directed to a specimen 1. An image of the specimen 1 is formed on an image recording device 16 by means of lenses 2, 3 and 4. An electron biprism 8 is mounted between the electron lenses 3 and 4. The specimen 1 is mounted on a specimen holder (not shown). When the operator sets a desired value of total magnification, predetermined exciting currents are passed through coils for the lenses. The value of the currents are selected so as to minimize aberration effect of the lenses. In this embodiment, the directional relationship between the specimen image and biprism is determined by the lenses 2 and 3. The observer decides propriety of the directional relationship and if necessary, applies a rotation angle of the biprism to the controller. The biprism is then rotated by the commanded rotation angle by means of a rotation drive mechanism 17 to place the directional relationship between the specimen image and biprism in a desired condition.

FIG. 4 shows an embodiment of a reflection type electron holography apparatus. Referring to FIG. 4, an electron beam emitted from an electron source 11 is collimated by means of a condenser lens 12 and a condenser aperture 13 and split, by means of a beam deflector 38 and an electron biprism 8', into two beams of which one is directed to a specimen 1 and the other is used as a reference wave. A reflection electron beam from the specimen 1 and the electron beams serving as the reference wave pass through a lens 2, an objective aperture 39, electron biprisms 8 and 8" and a lens 4 to form a hologram, and an image of the specimen 1 is formed on the viewing plane and presented to an image recording device 16 (hereinafter simply described as "formed on the image recording device 16"). The electron biprisms 8 and 8" are mounted downstream of the electron lens 2. The specimen 1 is mounted on a specimen holder (not shown). When the operator sets a desired value of magnification, exciting currents of values which are predetermined such that magnification values of the lenses of respective stages can be combined together at less aberration in accordance with the set magnification are passed through coils for the lenses. In this embodiment, the directional relationship between the specimen image and biprism is determined by the lens 2. The observer decides propriety of the directional relationship and if necessary, applies rotation angles of the biprisms 8 and 8' to the controller. The biprisms are then rotated by the commanded rotation angles by means of a rotation drive mechanism 17 to place the directional relationship between the specimen and the biprisms in a desired condition. In place of the biprisms 8 and 8", the biprism 8' may be rotated but in this case, the specimen must also be rotated by the same angle.

Figure 5:
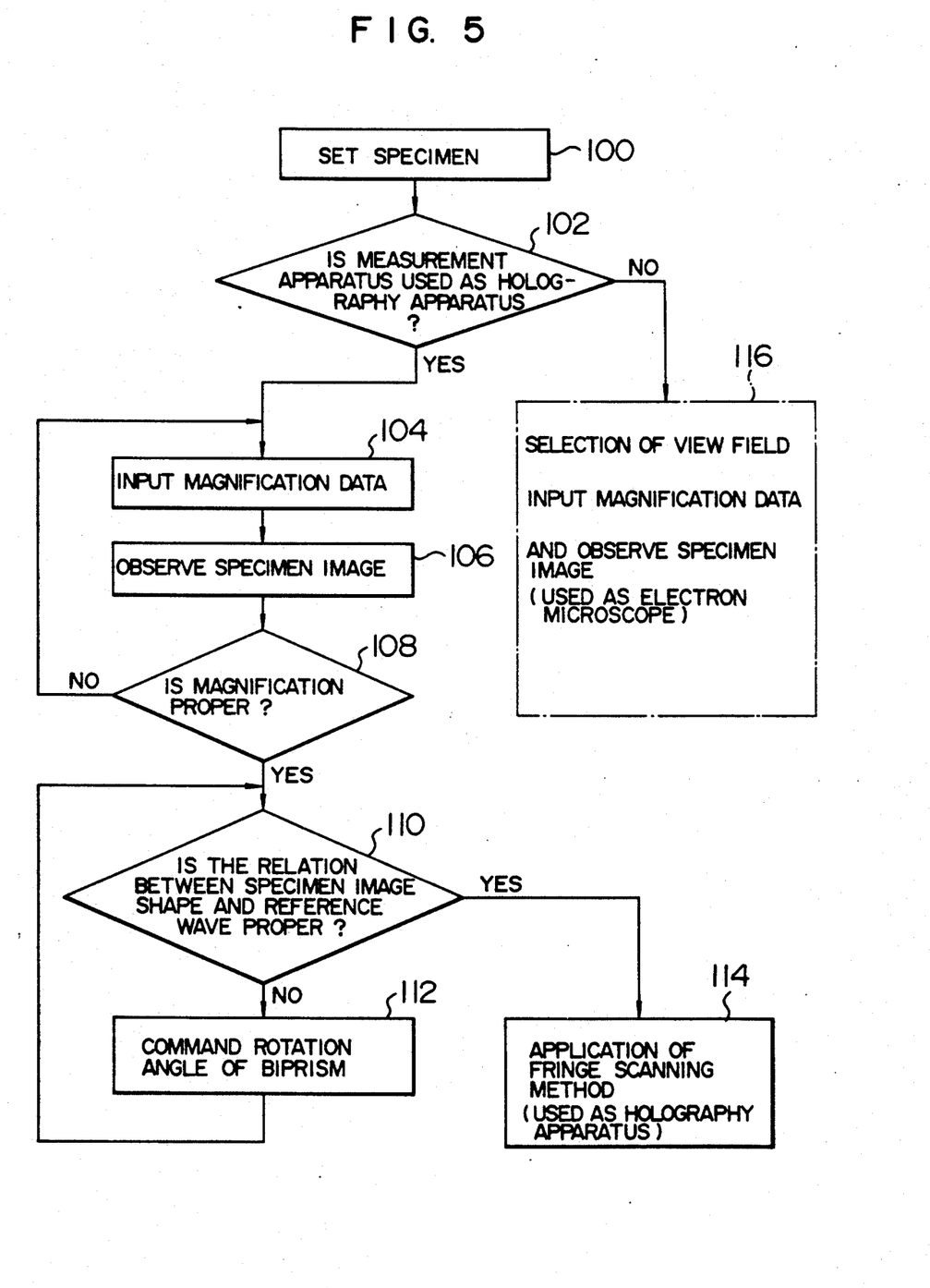
FIG. 5 is a flow chart showing the operational procedure in the first and second embodiments of the holography apparatus.

For better understanding, the operation of the electron holography apparatus can be summarized diagrammatically as shown in a flow chart of FIG. 5. The operator first sets a specimen in the specimen holder (step 100). Subsequently, selection is made as to whether the present measurement apparatus is used as a holography apparatus or an ordinary electron microscope (step 102). When the present apparatus is used as the holography apparatus (when step 102 issues YES), magnification data is inputted and thereafter propriety of the magnification is decided by observing a specimen image; and this procedure is repeated until a suitable value of magnification is reached (steps 104, 106 and 108). With the situation that the specimen image can be obtained at the suitable magnification settled, the relation between the specimen image and the reference wave, in other words, the directional relationship between the specimen and the electron biprism is checked and if the directional relationship is unsuitable, a rotation angle is commanded in order to correct the directional relationship (steps 110 and 112). The commanded rotation angle is transmitted to the rotation drive mechanism 17 which in turn operates to bring the directional relationship between the specimen image and the biprism into a desirable condition. When the directional relationship between the specimen image and biprism is determined to be satisfactory, the fringe scanning method is applied and the present apparatus is used as the holography apparatus to continue observation (step 114). The selection of application in step 102, inputting of magnification in step 104 and commanding of rotation angle in step 112 are carried out by applying necessary information to the controller 10 by the observer. Responsive to the information, the controller 10 provides necessary indication (for example, selection as to whether the present apparatus is used as the holography apparatus or the ordinary electron microscope, magnification and the like) and besides applies necessary signals to the lens power supply 9 and rotation drive mechanism 17. If so desired, the feedback function may be provided between these components to ensure movement as commanded, but the movement is eventually monitored by the observer and the simple open loop suffices. Namely, the observer can issue necessary commands until he is satisfied with the movement. As an example of operation of the present apparatus used as the holography apparatus to which the fringe scanning method is applied, one may refer to U.S. Pat. No. 4,935,625 to the present applicant.

If the use as the ordinary electron microscope is selected in step 102, the procedure proceeds to step 116 where the present apparatus is used as the electron microscope. In this step, there needs the same operations as those required when using the ordinary electron microscope, such as selection of view field, selection of magnification and observation of specimen image, and these operations can be carried out through the controller 10 as in the case of holography. How to use the present apparatus as the electron microscope will not be described herein but switching from holography will be described later.

Figure 6:
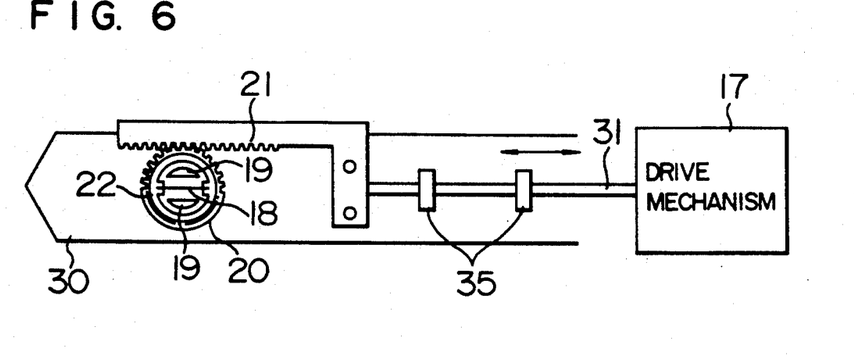
FIGS. 6 to 9 are diagrams showing embodiments of a rotation mechanism for the electron biprism.
Figure 7:
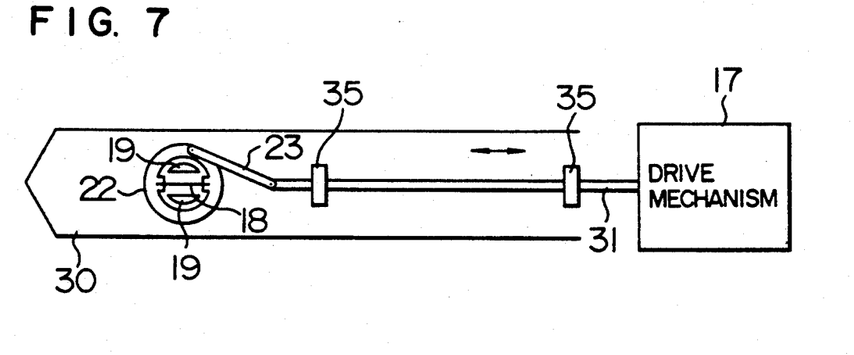
Figure 8:
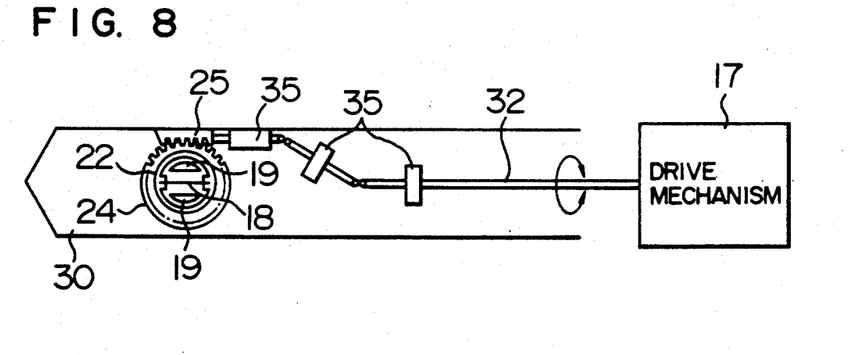
Figure 9:
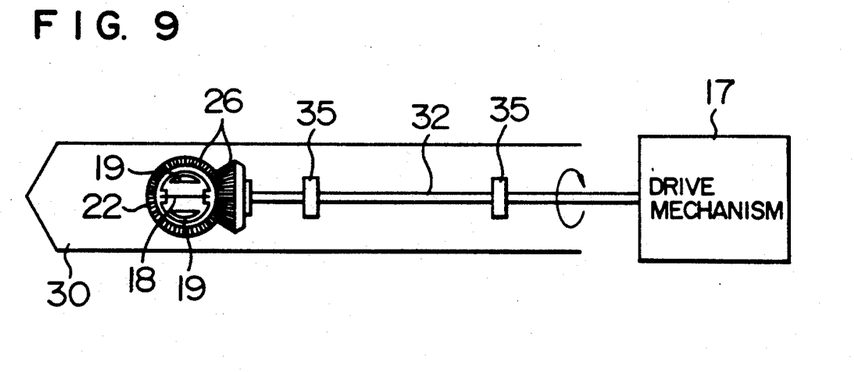

Rotation control of the electron biprisms 8, 8' or 8" will now be explained with reference to FIGS. 6 to 9. In the electron biprism, a central wire 18 and opposing electrodes 19 should keep their relative position to preserve electric fields around the central wire 18 and therefore they must undergo the same rotation under the application of force from the rotation drive mechanism 17. A specific example meeting this requirement will be described later. Denoted by 22 is a base of the electron biprism on which the central wire 18 and opposing electrodes 19 are arranged and which is rotatably mounted on a prism holder 30. The prism holder 30 is stably or immovably supported by the main body of apparatus. Force generated by the drive mechanism 17 causes horizontal movement of a drive shaft 31 or rotary motion of a drive shaft 32 and the base 22 can be rotated by either the shaft 31 or 32. Exemplarily, rotation is caused by using rack 21 and pinion 20 as shown in FIG. 6, a crank shaft 23 as shown in FIG. 7, a worm 25 and a worm gear 24 as shown in FIG. 8 and bevel gears 26 as shown in FIG. 9. In these Figures, reference numeral 35 designates a bearing for the dirve shaft. Any of motor, piezoelectric device and ultrasonic motor which have ability to respond to the signal from the controller 10 may be used as the drive mechanism 17.

Figure 10:
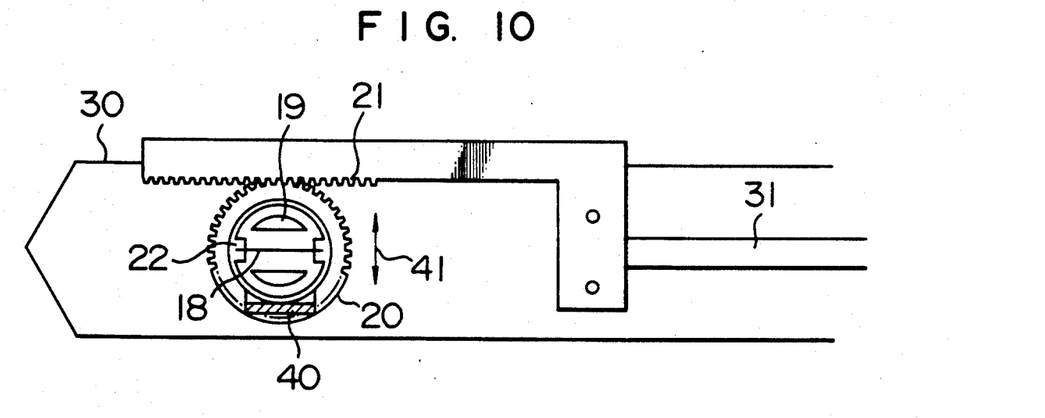
FIGS. 10 and 11 are diagrams showing a specific embodiment of the electron biprism according to the invention.
Figure 11:
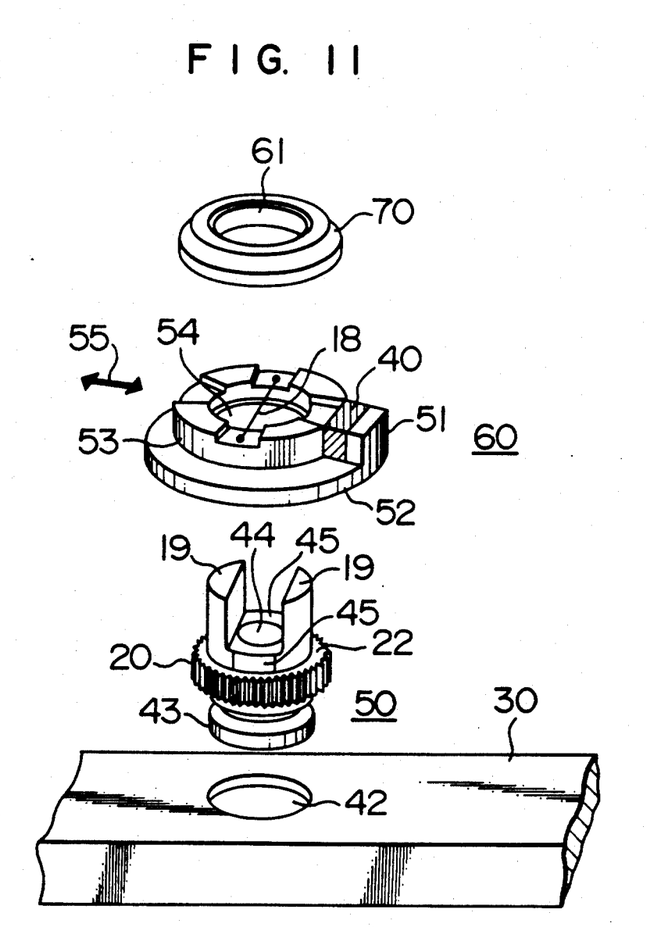

Referring to FIGS. 10 and 11, there is illustrated an example of a specified structure for displacing the central wire of the electron biprism to which the fringe scanning method can be applied. FIG. 10 is in particular a conceptual diagram useful in explaining movement of the central wire of the electron biprism according to the FIG. 6 embodiment. A ring for supporting the central wire 18 of the electron biprism is mounted with a piezoelectric device 40 to which voltage is applied to control movement in directions of arrows 41. FIG. 11 is an exploded perspective view showing details of the FIG. 10 electron biprism. A prism holder 30 is formed with a hole 42. An opposing electrode support, generally designated by reference numeral 50, includes a base 22, a shaft 43 extending from one end surface of the base and bearing against the hole 42, and electron biprism opposing electrodes 19 extending from the opposite end surface of the base. The central portion of the support 50 is formed with a hole 44 through which the electron beam passes as will be seen from FIGS. 1 and 3. The periphery of the base 22 is threaded to form a gear 20 with which threads of a rack 21 mesh. Straight walls 45 are provided at the roots of the opposing electrodes 19. A central wire support, generally designated by reference numeral 60, includes a slide guide 52 having at one end a projection 51, and a mount slide 53 slidable on the slide guide and having a central wire 18 applied at a predetermined position. A piezoelectric device 40 is disposed between the mount slide 53 and the projection 51. Formed in the slide guide 52 and mount slide 53 is a common hole 54 in which the opposing electrodes 19 are thrust to form an electron biprism. The common hole 54 has straight wall (not shown) associated with the aforementioned straight walls 45 and the former and latter straight walls cooperate to ensure that the opposing electrode support 50 can rotate along with the central wire support 60. The piezoelectric device 40 is mounted with necessary electrodes not shown and operable to control movement in directions of arrows 55 in accordance with voltage applied to the electrodes. Accordingly, the relative position to the opposing electrodes can be controlled. The mount slide 53 is made of an insulating material and therefore a necessary voltage can be applied across the central wire 18 and opposing electrodes 19 constituting the electron biprism. An electrically conductive cap 70 has its top formed with a hole 61. The cap 70 is applied to the mount slide 53 to cover it, thereby preventing electrons from impinging upon the insulating, wire mount slide 53 and accumulating thereon. The opposing electrode support 50, central wire support 60 and cap 70 are put together to form the unitary electron biprism as shown in FIG. 10. Thus, rotation by the rotation drive mechanism causes the opposing electrodes to rotate along with the central wire and movement by the piezoelectric device causes only the central wire to translate.

Figure 12:
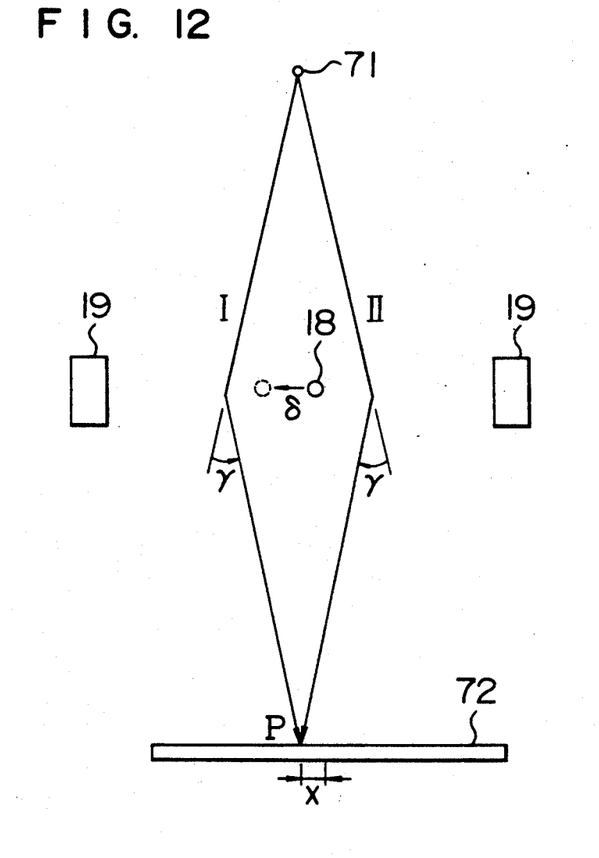
FIG. 12 is a diagram for explaining the embodiment of FIGS. 10 and 11.

The central wire 18 can be moved by the piezoelectric device by a distance sufficient for the fringe scanning method of the aforementioned U.S. Pat. No. 4,935,625 to be applied, as will be described below with reference to FIG. 12. FIG. 12 schematically shows the holography apparatus. In FIG. 12, elements as designated by reference numerals 71 and 72 respectively correspond to the electron source 11 and the image forming plane of image recording device 16 shown in FIG. 3 or 4. Denoted by 18 and 19 are the central wire and the opposing electrodes of the electron biprism. The central wire 18 is mounted to the electrically insulating mount slide 53 as described in connection with FIG. 11 and hence it can be set to a desired potential relative to the opposing electrodes (generally at earth potential). Assuming now that when the central wire takes a position as indicated by solid line and is at a potential $U_F$, an electron beam from the electron source 71 is deflected toward the center by an angle $\gamma$, the angle $\gamma$ is given by the following equation:

$$\gamma = \gamma_0 \cdot U_F$$

where $\gamma_0$ is about $2 \times 10^{-6}$ [rad/V] for electrons emitted from the electron source 71 which is at a potential of 100 KV. At that time, the path difference $\Delta$ between paths I and II for two electron beams converging to a point P at a position x on the image forming plane 72 is given by $$\Delta = 2 \cdot \gamma \cdot x.$$

Electron beams coming from the two paths are mutually intensified at points where the path difference $\Delta$ equals integer times the wavelength of the electron beam but are mutually weakened at points which displace from the former points by the half wavelength, thereby forming so-called interference fringes. Pitch d between adjacent fringes is given by $$d = \frac{\lambda}{2 \cdot \gamma}$$

where $\lambda$ is the wavelength of electron beam. If the central wire 18 is moved by $\delta$ to a position indicated by dotted line, then the path difference $\Delta'$ between paths I and II for the two electron beams is given by $$\Delta' = 2 \cdot \delta \cdot \gamma + 2 \cdot \gamma \cdot x.$$

Namely, after the movement, a phase difference of $2 \cdot \delta \cdot \gamma$ takes place. Since $\gamma$ is a quantity which is determined by the potential $U_F$ at the central wire 18, the phase difference between the two waves interfering with each other can be controlled by moving distance $\delta$ of the prism. For example, given that $\gamma = 2 \times 10^{-4}$ [rad] and the wavelength of electron beam is 0.04 Å, the phase difference can be changed by one wavelength when $\delta = 100$ Å stands. The magnitude of this moving distance can be obtained by using the piezoelectric device in the ordinary manner, raising no practical problem.

According to the fringe scanning method disclosed in the previously quoted U.S. Pat. No. 4,935,625, the phases of object wave and reference wave are shifted to obtain a plurality of holograms and determine a phase distribution precisely. This can also be achieved by the present invention. In accordance with the invention, even in a holography apparatus which is not based on the fringe scanning method but merely forms interference fringes, the directional relationship between electron biprism and specimen image can obviously be controlled at an operator's desire to ensure high operational facilities.

Figure 13:
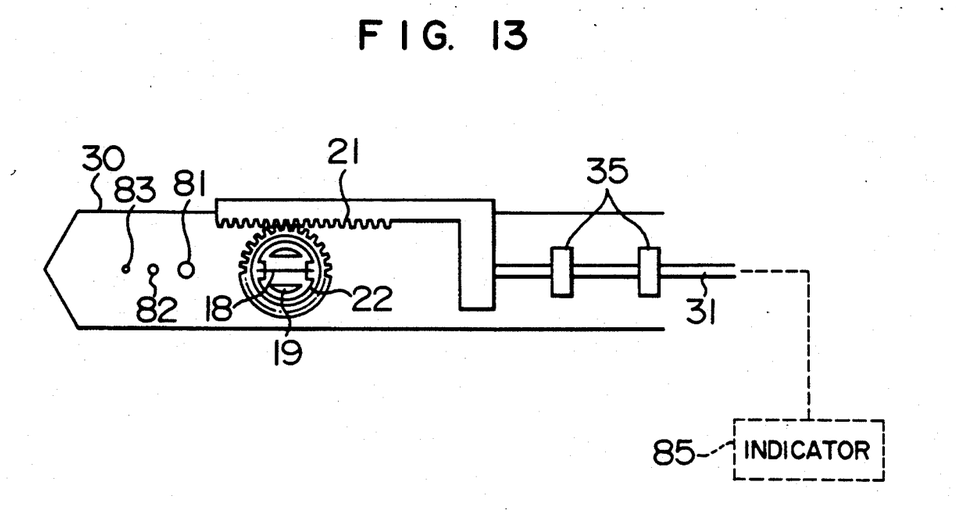
FIG. 13 is a diagram useful to explain a further embodiment of the invention wherein the measurement apparatus is used as an electron microscope.

Another embodiment of the invention will now be described wherein the present measurement apparatus is so contrived as to be used as an ordinary electron microscope. In this embodiment, the design of the prism holder 30 of the FIG. 6 embodiment is modified as shown in FIG. 13. As in the case of the FIG. 6 embodiment, an electron biprism includes a base 22, a central wire 18 and opposing electrodes 19 which are rotatably supported on a prism holder 30. In contrast to the prism holder 30 of the FIG. 6 embodiment which is supported stably or immovably by the main body of apparatus, the holder 30 of the present embodiment can also be controlled for movement by a drive mechanism 17 through a device the specific construction of which is omitted in FIG. 13. More specifically, when a drive shaft 31 horizontally movable by force applied from the drive mechanism 17 is moved by a predetermined distance in a predetermined direction (to the right in the example illustrated) and thereafter the drive shaft 31 further exerts force in the same direction, the prism holder 30 per se may be caused to move. The holder 30 is formed with a plurality of apertures 81, 82 and 83 of different diameters as shown in FIG. 13 and can be controlled by the operator such that the center of a desired aperture can be aligned selectively with that of the electron biprism. Denoted by 85 is an indicator adapted to indicate a position selected by the operator. With this construction, when one of the apertures is selected, an electron beam does not undergo deflection by the biprism and therefore the measurement apparatus functions as an ordinary electron microscope. The aperture can be used as a selected-area aperture of ordinary electron microscope. When being about to proceed with the use as the electron microscope, the operator first selects "NO" in step 102 shown in FIG. 5. By this, the procedure proceeds to step 116 where the use as the electron microscope is allowed and the operator may start operation by moving the holder 30 and selecting a view field.

We claim:

1. An electron holography apparatus having an electron source, a specimen holder, an electron lens system and electron biprism means, said apparatus comprising means for rotating at least one of a specimen and said electron biprism means about the electron optics axis so as to adjust and maintain a determined directional relationship between a specimen image and said electron biprism means independent of changes of a magnification of the electron lens system.

2. An electron holography apparatus according to claim 1 wherein the rotation angle of said electron holography apparatus about the electron optics axis is commanded by the operator.

3. An electron holography apparatus having an electron source, a specimen holder, an electron lens system and electron biprism means, said apparatus comprising means for translating a central wire of said electron biprism means in a direction orthogonal to the electron optics axis.

4. An electron holography apparatus having an electron source, a specimen holder, an electron lens system and electron biprism means, said apparatus comprising means for rotating at least one of a specimen and said electron biprism means about the electron optics axis, and means for translating a central wire of said electron biprism means in a direction orthogonal to the electron optics axis.

5. An electron holography apparatus having an electron source, a specimen holder, an electron lens system, electron biprism means and aperture means, said apparatus comprising means for selectively utilizing one of said electron biprism means and said aperture means so that when said electron biprism means is selected said electron holography apparatus serves as an electron holography apparatus and when said aperture means is selected said electron holography apparatus serves as an electron microscope.

* * * * *